(12) United States Patent
Gao et al.

(10) Patent No.: US 7,373,030 B2
(45) Date of Patent: May 13, 2008

(54) PLANAR OPTICAL CIRCUIT

(75) Inventors: Zhan Gao, München (DE); Bernd Krombholz, München (DE); Jens Dieckröger, München (DE); Ingo Baumann, Zorneding (DE)

(73) Assignee: Finisar Corporation, Sunnyvale, CA (US)

( * ) Notice: Subject to any disclaimer, the term of this patent is extended or adjusted under 35 U.S.C. 154(b) by 450 days.

(21) Appl. No.: 10/706,492

(22) Filed: Nov. 12, 2003

(65) Prior Publication Data

US 2004/0120633 A1 Jun. 24, 2004

(30) Foreign Application Priority Data

Nov. 12, 2002 (DE) .................. 102 53 440

(51) Int. Cl.
*G02B 6/12* (2006.01)
*G02B 6/26* (2006.01)

(52) U.S. Cl. .......................... 385/14; 385/50

(58) Field of Classification Search ................. 385/14, 385/48, 50
See application file for complete search history.

(56) References Cited

U.S. PATENT DOCUMENTS

| | | | |
|---|---|---|---|
| 3,947,840 A | 3/1976 | Craford et al. | |
| 4,468,085 A | 8/1984 | Papuchon et al. | |
| 4,929,515 A | 5/1990 | Matz et al. | |
| 4,938,594 A | 7/1990 | Pavlath | |
| 4,978,188 A | 12/1990 | Kawachi et al. | |
| 5,037,507 A | 8/1991 | Matz et al. | |
| 5,321,779 A * | 6/1994 | Kissa | 385/14 |
| 6,418,246 B1 * | 7/2002 | Gampp | 385/14 |
| 6,647,185 B2 * | 11/2003 | Hajjar et al. | 385/48 |
| 6,753,958 B2 * | 6/2004 | Berolo et al. | 356/328 |
| 6,868,222 B2 * | 3/2005 | DePue et al. | 385/140 |
| 2002/0131685 A1 * | 9/2002 | He et al. | 385/24 |
| 2004/0033004 A1 * | 2/2004 | Welch et al. | 385/14 |

FOREIGN PATENT DOCUMENTS

| | | |
|---|---|---|
| DE | 37 30 971 A1 | 3/1989 |
| DE | 37 30971 A1 | 3/1989 |
| DE | 39 29 999 A1 | 4/1990 |
| DE | 198 19 150 A1 | 11/1999 |
| EP | 0 328 886 A2 | 8/1989 |
| EP | 0 397 337 A2 | 11/1990 |
| JP | 61023377 A | 1/1986 |
| JP | 02090109 A | 3/1990 |
| JP | 2002031748 A | 1/2002 |
| WO | WO 00/45154 A1 | 8/2000 |

* cited by examiner

*Primary Examiner*—Jerry Rahll
(74) *Attorney, Agent, or Firm*—Workman Nydegger

(57) ABSTRACT

The invention relates to a planar optical circuit having a waveguide structure and at least one monolithic or hybrid integrated optical component. A mechanism for influencing the propagation of scattered light in the planar optical circuit in a targeted manner is employed and integrated into the planar optical circuit. The disadvantageous effects of scattered light are reduced in that scattered light is captured, absorbed, reflected or concentrated onto a narrow region by means of the integrated structures.

18 Claims, 8 Drawing Sheets

PLANAR OPTICAL CIRCUIT

REFERENCE TO RELATED APPLICATIONS

This application claims the benefit of the priority date of German application DE 102 53 440.3, filed on Nov. 12, 2002, the contents of which are herein incorporated by reference in their entirety. FIELD

FIELD OF THE INVENTION

The present invention is directed to optical components, and more particularly to a planar optical circuit.

BACKGROUND OF THE INVENTION

It is known for optical components to be integrated into a planar optical circuit in monolithic or hybrid fashion. Examples of the components are optical phased arrays (AWG—arrayed waveguide grating), variable attenuator units (VOA—variable optical attenuator) and power monitoring devices (PM—power monitor) which detect the optical power in an optical waveguide of the planar optical circuit. Optical phased arrays are used in particular as wavelength division multiplexers and demultiplexers in WDM (wavelength division multiplex) and DWDM (dense wavelength division multiplex) based transmission links. Variable attenuator units make it possible to perform a channel-dependent attenuation of the levels of individual data channels of an array. Different levels of the optical channels can be equalized by means of the channel-dependent attenuation. Power monitoring is realized by means of photodiodes and serves for monitoring the signal powers in individual waveguides.

An ever present problem in planar optical circuits is the existence of undesirable scattered light. Scattered light arises for example in variable attenuator units, as is explained below with reference to FIGS. 9 and 10. An attenuator unit is realized for example by a Mach-Zehnder interferometer 100. A Mach-Zehnder interferometer 100 has an input waveguide 101 having an input power Pin, an input port 102, a first arm 103, a second arm 104, an output port 105 and an output waveguide 106 having the output power Pout. A heating element 110 is situated on one arm 103 of the Mach-Zehnder interferometer 100. Heating of the heating element changes the temperature in the corresponding arm 103 and the refractive index thereof. This results in a phase difference between the signals of the two arms 103, 104, which leads to a change in the output power $P_{out}$.

Provided that there is no phase difference between the two arms 103, 104, the output power $P_{out}$ reaches a maximum, while the output power $P_{out}$ is at a minimum given a phase difference of π. As soon as a phase difference occurs between the two arms 103, 104, a part of the light is in this case emitted or radiated from the optical waveguide. The emission of light is at a maximum given a phase difference of π.

The situation is then such that the emitted light is hardly absorbed by the light-guiding substrate of the planar optical circuit. Rather, the majority of the scattered light propagates arbitrarily in the substrate. FIG. 10 shows the simulation result for the field distribution in a Mach-Zehnder interferometer in accordance with FIG. 9, the phase difference between the two arms 103, 104 being π. The scattered light X propagates essentially conically proceeding from the output port 105, that is to say the confluence region of the two waveguide arms 103, 104. In this case, the intensity of the scattered light X is greatest in the vicinity of the output waveguide 106 and decreases with increasing distance from the output waveguide 106.

The scattered light X illustrated diagrammatically in FIG. 10 poses a problem from a number of standpoints. Firstly, it disturbs the function of photodiodes which are mounted in trenches or cutouts of the substrate and, by way of example, perform power monitoring of the optical signals of individual waveguides. The disturbance signal may reach the level of the useful signal in this case. A further problem is that the emitted scattered light may couple into adjacent channels and thus generates an undesired crosstalk.

SUMMARY OF THE INVENTION

The present invention is accordingly based on the object of providing a planar optical circuit in which the disadvantages that arise with scattered light are reduced.

Accordingly, the solution according to the invention is distinguished by the fact that means which influence the propagation of scattered light in the planar optical circuit in a targeted manner are integrated into the planar optical circuit. In this case, the invention is based on the concept of reducing the disadvantageous effects of scattered light not by downstream signal processing, for instance, but rather by means which are integrated in the planar optical circuit itself and influence the propagation of scattered light that is present, the scattered light being either captured, absorbed, reflected or concentrated onto a narrow region, so that possible adjacent channels are not disturbed. The scattered light can also be guided into regions of the planar optical circuit where it does not manifest a disturbing effect, and/or be detected in a defined manner.

The influencing of the propagation of the scattered light in the planar optical circuit may take the form, for example, of capture and/or deflection of the scattered light, absorption or diversion, it also being possible for a combination of these influencing mechanisms to be effected.

By its nature, the scattered light that propagates in a planar optical circuit propagates in the plane in which the light-guiding structures are formed. The integrated means which influence the propagation of scattered light that is present are likewise formed at least partially in said plane.

In a preferred refinement of the invention, capture and deflection of scattered light is effected by an additional waveguide, one end of which is arranged in the vicinity of a scattered light source of the planar optical circuit. The scattered light is captured by the additional waveguide at its source, deflected by the additional waveguide and, at that end of the additional waveguide which is remote from the scattered light source, by way of example, led out laterally from the planar optical circuit, absorbed or detected in a defined manner, as will be explained below.

Preferably, at least one Mach-Zehnder interferometer with an input port and an output port is provided as a scattered light-generating optical component, the additional waveguide being arranged in the vicinity of the output port of the Mach-Zehnder interferometer. Preferably, an additional waveguide is arranged in a symmetrical arrangement in the region of the output port on both sides of the output waveguide of the Mach-Zehnder interferometer.

The additional waveguide may run in a bent or S-shaped fashion. It has, by way of example, a first, straight region, through which scattered light is coupled in and which preferably runs essentially parallel to an adjacent waveguide. The additional waveguide also has an S-shaped region, which adjoins the first straight region and via which the coupled-in scattered light is guided away.

In a preferred refinement, it is provided that the end of the additional waveguide which is remote from the scattered light source is in each case terminated by a photodiode, so that the light power of the scattered light can be detected. Preferably, the photodiode is in each case connected to an evaluation unit, which, by means of the detected scattered light, indirectly determines the optical power of the signal at the output of the optical component generating scattered light. This enables the power of a waveguide to be monitored without light being coupled out separately from the waveguide.

In a further preferred refinement of the invention, the means for influencing the propagation of scattered light in the planar optical circuit is formed by a scattered light-absorbing structure, which, in particular, is an elongate trench or some, other cutout in the planar optical circuit. In this case, for the purpose of scattered light absorption, the trench is preferably filled with an absorbent substance, for example iron-containing liquids or polymers with color pigments which can be cured thermally or by UV light.

Instead of absorbing structures, it is also possible as an alternative to use reflecting structures, which are preferably likewise formed by a trench in the planar optical circuit. In this case, the trenches are preferably arranged in such a way with regard to a scattered light source that the scattered light is subjected to total reflection at the light trenches.

In a preferred embodiment, a plurality of trenches are arranged parallel to one another, a waveguide in each case running between two trenches. The waveguide preferably originates in each case from a scattered light-emitting optical component, in particular a Mach-Zehnder interferometer. The radiated scattered light is in each case prevented from coupling into an adjacent waveguide through the trenches running parallel. In addition, it may be provided that the region between two trenches is in each case assigned at least one scattered light-detecting photodiode for power monitoring.

A further preferred refinement of the present invention provides for reflecting structures to be realized at a cutout in the planar optical circuit, which terminates a waveguide of the planar circuit and in which, by way of example, a photodiode is arranged. Such a photodiode serves for example for the power monitoring of a channel from a multiplicity of wavelength channels of the planar optical circuit. Such cutouts with photodiodes for power monitoring are known per se. One problem, however, is that the cross section of the photodiodes is in the region of a few hundred µm. The cross section of an individual waveguide, however, is generally only a few µm, typically 6 µm×6 µm. This has the effect that a photodiode detects not only the optical signal from the waveguide cross section but also scattered light in the region of the waveguide. Forming a reflecting structure at the cutout ensures that scattered light is reflected away from the cutout and, accordingly, does not reach the photodiode. For this purpose, it is preferably provided that the cutout tapers symmetrically in the direction of the waveguide and, in this case, in particular has two side walls running obliquely toward one another.

BRIEF DESCRIPTION OF THE DRAWINGS

The invention is explained in more detail below using a plurality of exemplary embodiments with reference to the figures of the drawing, in which.

DETAILED DESCRIPTION OF THE INVENTION

Figure 1:
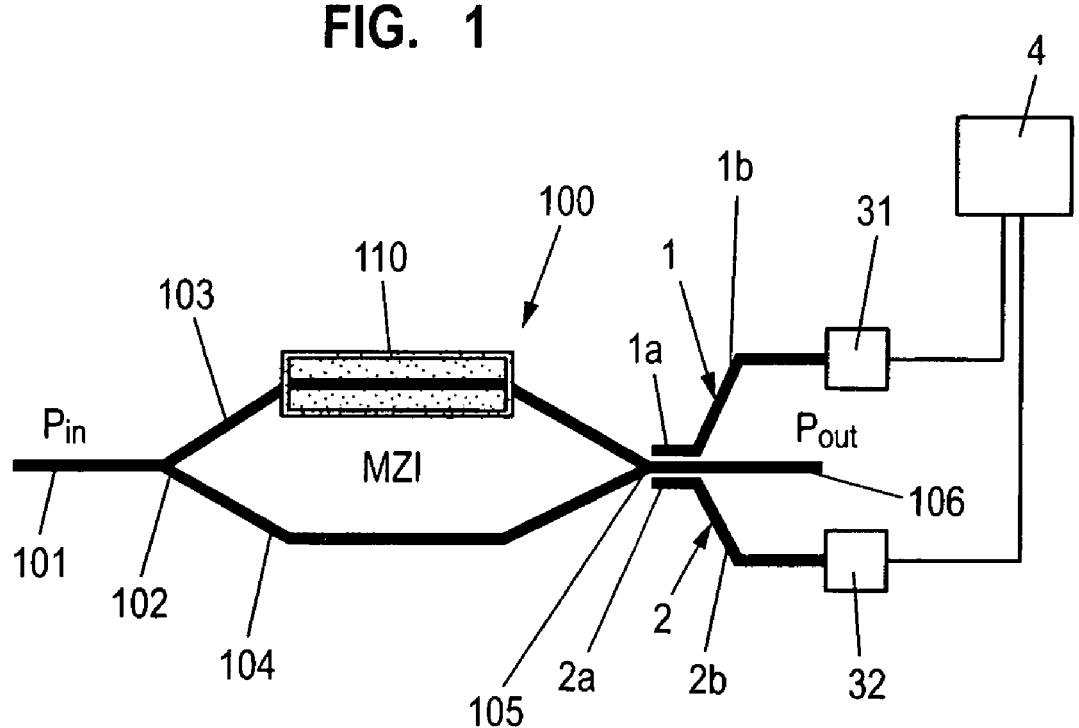
FIG. 1 diagrammatically shows a Mach-Zehnder interferometer with two additional waveguides for capturing and diverting scattered light.
Figure 9:
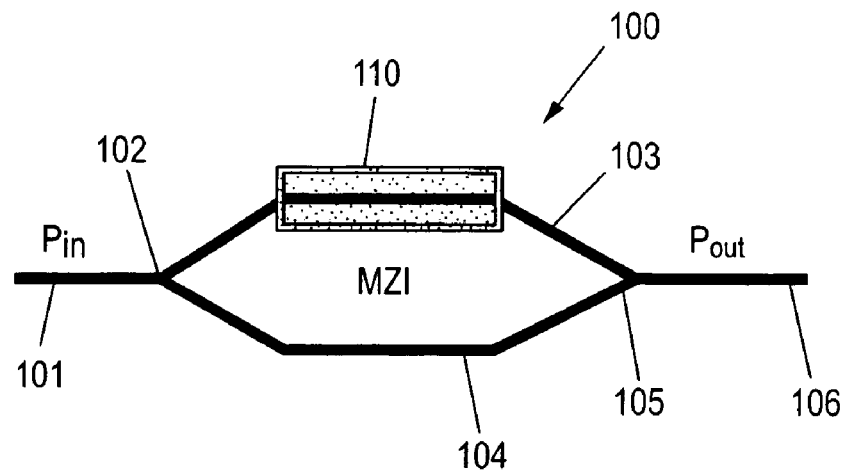
FIG. 9 shows a Mach-Zehnder interferometer known from the prior art.

FIG. 1 shows a Mach-Zehnder interferometer as has already been described per se in the introduction with reference to FIG. 9. Two additional waveguides 1, 2 are formed in the planar optical substrate in the region of the output port 105 of the Mach-Zehnder interferometer 100. The two additional waveguides 1, 2 are arranged symmetrically with respect to the output waveguide 106 of the Mach-Zehnder interferometer. They each have a first, straight section 1a, 2a, which runs essentially parallel to the output waveguide 106 and the end of which lies in the vicinity of the scattered light source, that is to say in the vicinity of the output port 105, in which the light signals of the two waveguide arms 103, 104 converge. The first, straight region 1a, 2a is adjoined by an angled region 1b, 2b, through which scattered light coupled into the additional waveguide 1, 2 is guided away from the output waveguide 106. The angled region 1b, 2b guides the scattered light for example to an edge area of the planar optical circuit or into a region in which it is absorbed.

In the exemplary embodiment illustrated, the scattered light detected by the additional waveguide 1, 2 is in each case fed to a photodiode 31, 32, which terminates the respective additional optical waveguide 1, 2. The photodiode signal registers the scattered light X in this case. Since this is related to the optical signal of the output waveguide $P_{out}$ and of the input waveguide $P_{in}$ approximately in accordance with the formula: $P_{out}=P_{in}-2X$, it is possible, given knowledge of the variable $P_{in}$, to determine from the detected scattered light signal the power $P_{out}$ in the output waveguide 106 and thus also the degree of attenuation effected. Corresponding evaluation is effected by a diagrammatically illustrated evaluation unit 4 connected to the two photodiodes 31, 32. Thus, with such an arrangement, the detected and derived scattered light can be used to indirectly determine the optical power in the output waveguide 106. A separate arrangement for monitoring the optical power of the individual waveguide channels may then advantageously be dispensed with.

It may also be provided that the evaluation unit 4 is part of a control loop which sets the heating power of the heating element 110 to a desired value, i.e. a desired signal attenuation and output power $P_{out}$.

Figure 2:
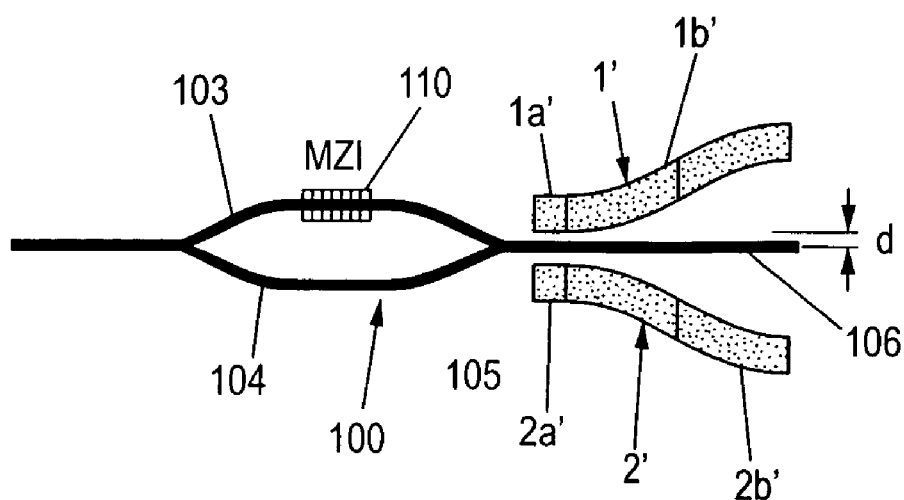
FIG. 2 shows an exemplary embodiment of a Mach-Zehnder interferometer with two additional waveguides, the additional waveguides being formed in S-shaped fashion.

FIG. 2 shows a concrete configuration of the arrangement illustrated in FIG. 1. There are once again two waveguides 1', 2' situated in the vicinity of the output port 105 of the Mach-Zehnder interferometer, said waveguides each comprising a straight part 1a', 2a' and an S-shaped part 1b', 2b'. The scattered light is captured by the straight parts 1a', 2a' and guided to a defined location through the S-shaped parts 2a', 2b'. The width of the two additional waveguides 1', 2' is 20 μm, for example, the length of the straight part 1a', 2a' is 200 μm, for example, and the distance d between the straight part 1a', 2a' of the additional waveguide and the output waveguide 106 of the Mach-Zehnder interferometer 100 is 7 μm, for example. In this case, the distance d is chosen to be large enough to largely prevent light that is guided in the output waveguide 106 from coupling out into the additional waveguide 1', 2'.

Figure 3:
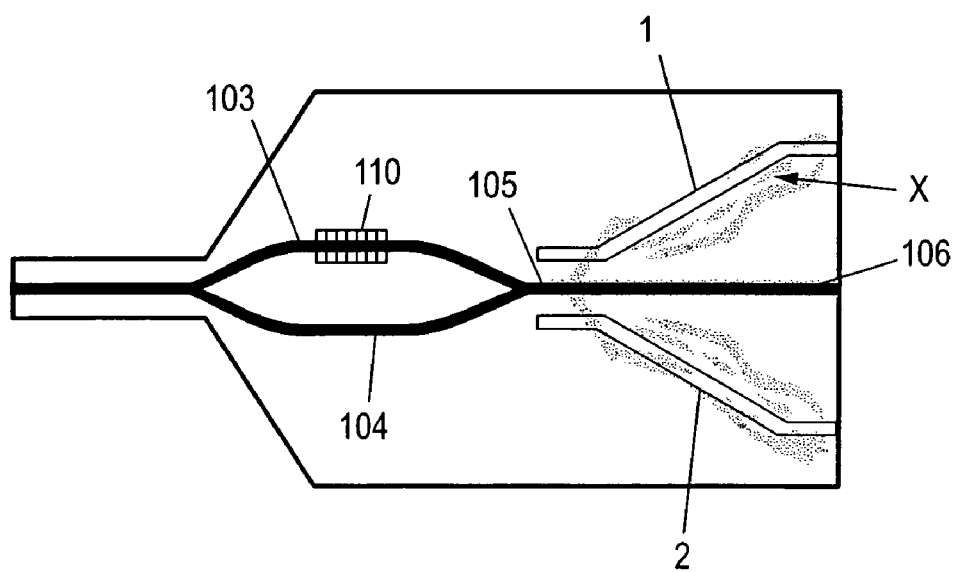
FIG. 3 shows a Mach-Zehnder interferometer with two additional waveguides, the field distribution in the region of the additional waveguides being diagrammatically illustrated.
Figure 10:
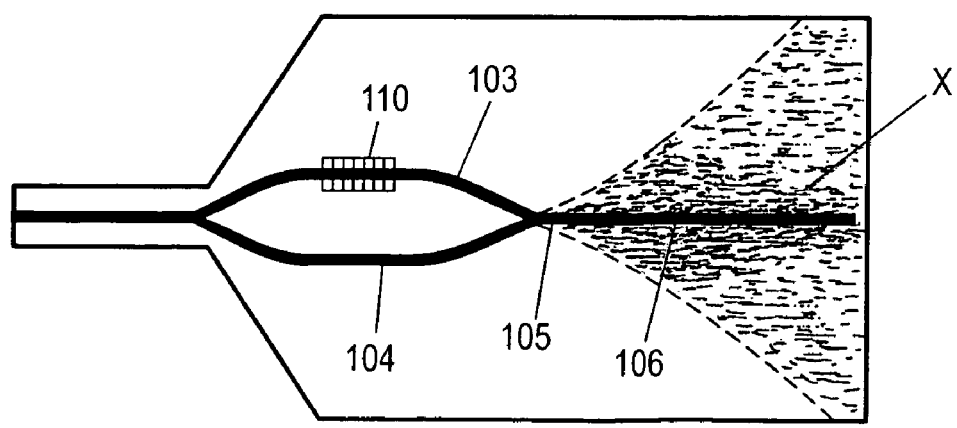
FIG. 10 shows a Mach-Zehnder interferometer with an illustration of the scattered light that arises in the output region.

FIG. 3 shows the result of a simulation of the field distribution in a structure with two additional waveguides 1, 2 in accordance with FIGS. 1 and 2. The two additional waveguides 1, 2 are also illustrated in this case. The parameters are the same as those of the simulation of FIG. 10 explained in the introduction. It can clearly be seen that the scattered light X is concentrated in the vicinity of the additional waveguides 1, 2. The field strength of the scattered light X is greatly reduced at other locations.

Figure 4:
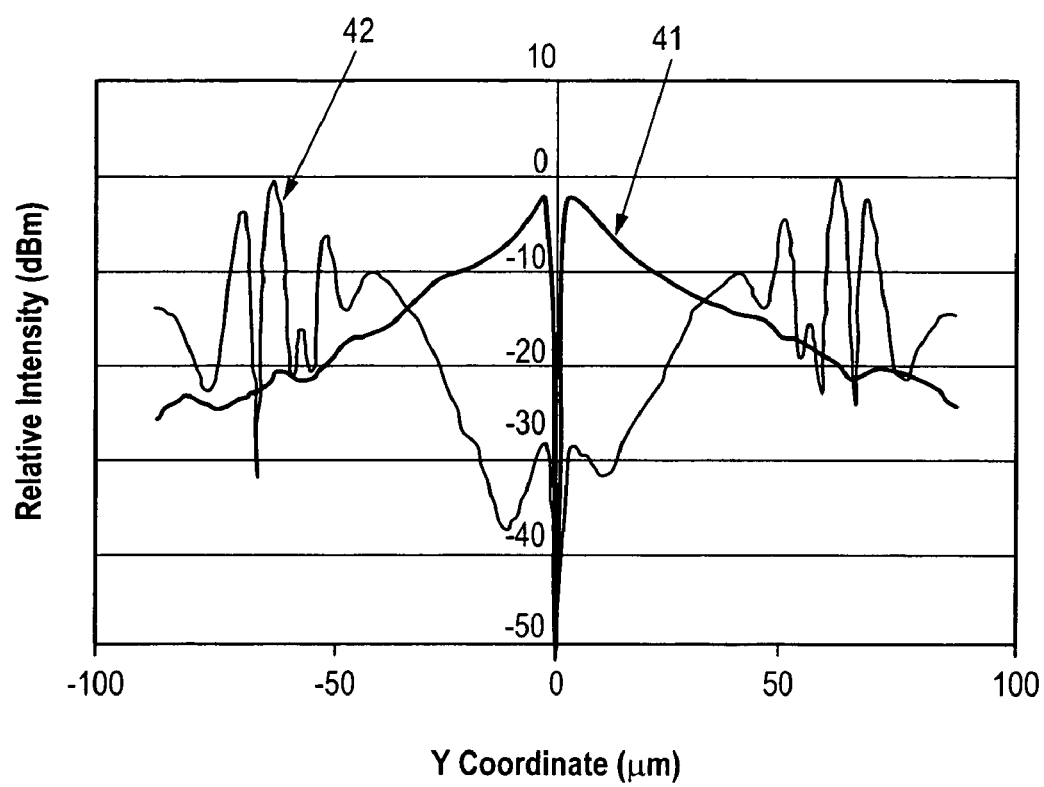
FIG. 4 shows the relative scattered light intensity as a function of the distance from the output waveguide on the one hand with the use of additional waveguides for scattered light reduction and on the other hand without the use of such additional waveguides.

This result is also reflected in the curves of FIG. 4, which illustrate the relative intensity of the scattered light as a function of the distance from the output waveguide of a normal Mach-Zehnder interferometer and of a Mach-Zehnder interferometer with two additional waveguides. The curve 41 depicted somewhat thicker shows the scattered light field distribution in the case of a Mach-Zehnder interferometer without additional waveguides. The scattered light is at a maximum adjacent to the output waveguide 106 and decreases continuously with increasing distance Y from the output waveguide. The curve 42 depicted somewhat thinner indicates the relative scattered light intensity with the use of a Mach-Zehnder interferometer with two additional waveguides. The additional waveguides make it possible to reduce the intensity of the scattered light in the vicinity of the output waveguide 106 by −30 dBm, that is to say a factor of 1 000. The respective lateral region characterized by alternate maxima and minima corresponds to the position of the respective additional waveguide. The scattered light is thus successfully concentrated in the region of the additional waveguides and can be captured and diverted by the latter.

The influence of the two additional waveguides on the optical loss of the Mach-Zehnder interferometer at zero attenuation was additionally calculated. The additional loss on account of light being additionally coupled out into the additional waveguide is merely 0.1 dB.

Figure 5:
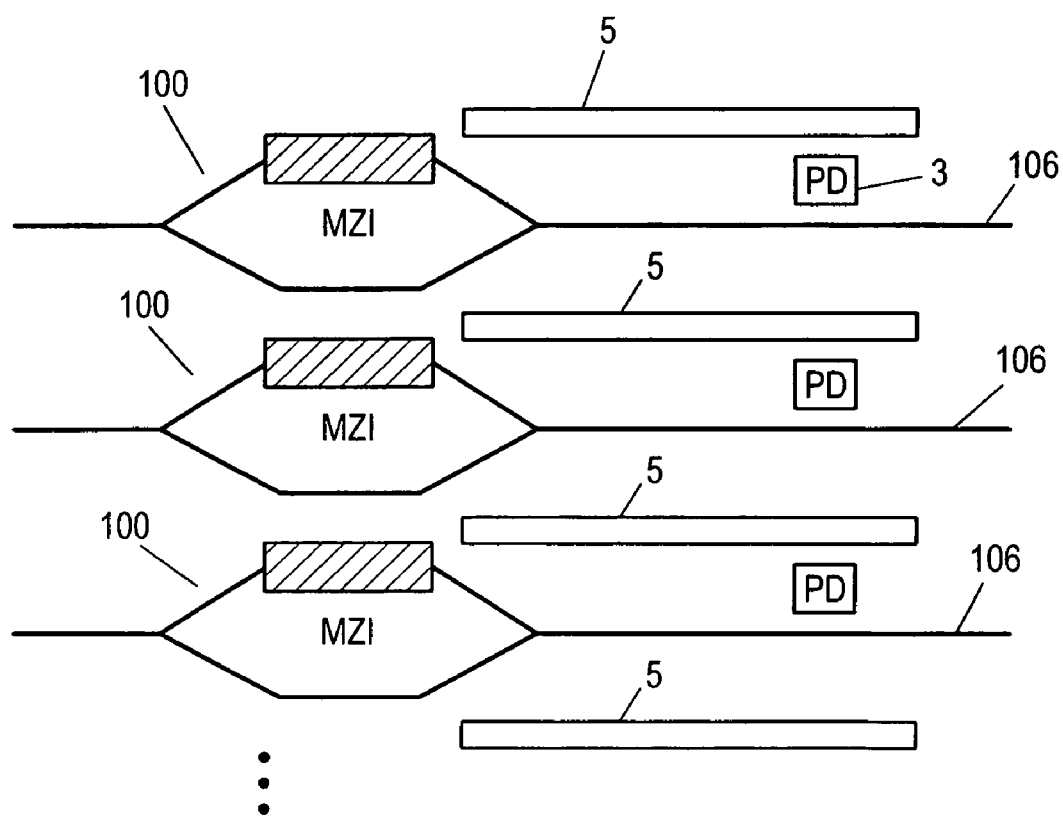
FIG. 5 shows an array of Mach-Zehnder interferometers and waveguides in which the individual waveguides are in each case insulated from one another with regard to scattered light by means of absorbing trenches.

FIG. 5 illustrates a multi-channel attenuator comprising an array of Mach-Zehnder interferometers 100. There is the problem that each attenuator 100 emits a scattered light cone when it is activated, as explained in the introduction with reference to FIGS. 9 and 10. In an array of attenuators 100, there is the particular problem that the scattered light of one channel can couple into an adjacent channel and thus produce an undesired crosstalk.

Furthermore, thought is to be given, as explained with reference to FIG. 1, to utilizing the scattered light cone of each channel for the purpose of power monitoring as well, by the optical output power of the attenuator being measured indirectly by means of an integrated photodiode 3 in the scattered light cone of each channel. However, this is only practically possible if the scattered light of the adjacent channels in each case does not reach the photodiode 3.

In order to insulate the individual output waveguides 106 or wavelength channels with regard to their scattered light, in accordance with FIG. 5, it is provided that trenches 5 are introduced into the waveguide layer. The trenches 5 can be introduced into the waveguide layer for example by means of etching technology. The trenches prevent the undisturbed propagation of the scattered light and lead to a desired insulation of the individual waveguide channels 106 with regard to the scattered light that respectively arises.

This effect is intensified if, as is preferably provided, light-absorbing substances 6 are filled into the trenches. Examples of the light-absorbing substances 6 are iron-containing liquids or polymers with color pigments which can be cured thermally or by UV light, so that they can easily be introduced into the trenches 5. In this way, the individual trenches 5 are ideally insulated with respect to one another, with the result that a crosstalk brought about by scattered light is prevented and, as illustrated, it is even possible for photodiodes 3 optionally to be integrated into the individual locally concentrated scattered light regions of each attenuator 100.

It is pointed out here that, in principle, it is also possible, in addition, to use additional waveguides in accordance with FIGS. 1-3 in the exemplary embodiment of FIG. 5. This is not absolutely necessary, however, given a suitable arrangement of the photodiode 3.

It is further pointed out that, in the exemplary embodiment of FIG. 5, only one photodiode 3 in each case is arranged on each side of an output waveguide 106. Since the scattered light essentially has the same intensity on both sides of an output waveguide 106, that is to say in each case between output waveguide 106 and associated trench 5, the total power of the scattered light of a Mach-Zehnder interferometer 100 is produced to an approximation by multiplying the power detected by the photodiode 3 by the factor 2.

Figure 6:
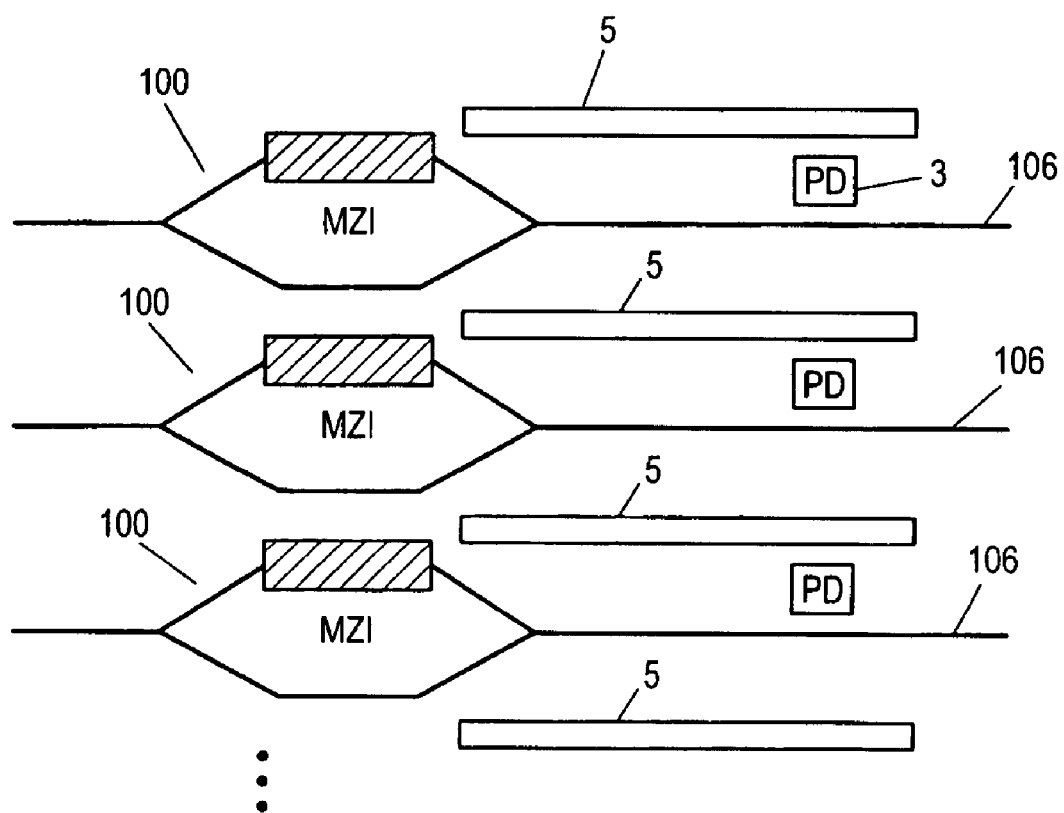
FIG. 6 shows an array of Mach-Zehnder interferometers and waveguides, the individual waveguides in each case being insulated from one another with regard to scattered light by means of reflecting trenches.

The exemplary embodiment of FIG. 6 essentially corresponds to the exemplary embodiment of FIG. 5. The only difference is that the trenches 5 interrupting the waveguide layer are not filled with an absorbent substance in the exemplary embodiment of FIG. 6. Rather, instead of absorption, the effect of total reflection is utilized for insulation of the individual regions.

By way of example, the planar optical circuit is embodied using $SiO_2$ on Si technology. For production purposes, three $SiO_2$ layers are applied on a silicon wafer in a manner known per se, said layers usually being called the buffer layer, core layer and covering layer and each having different refractive indices. In this case, the central core layer has the largest refractive index. Before said core layer is covered with the outer covering layer, it is patterned with the aid of a photolithographically produced mask and an etching method, so that only individual ribs of said layer remain. These ribs are coated with the covering layer and then form the light-guiding waveguide core, which is situated such that it is buried about 20 μm in an SiO$_2$ layer system having a thickness of approximately 40 μm and usually has a cross section of approximately 6×6 μm.

The trenches 5 interrupt at least the SiO$_2$ layer system in which the scattered light propagates, but may, in principle, also extend into the silicon substrate.

If the trenches 5 are then etched into the SiO$_2$-based waveguide layer and filled with air, a natural refractive index contrast of >0.44 results. The following holds true for the angle α of total reflection in the transition from the glass to air: sin α>1/n$_{glass}$. An angle of >43.83° results for n$_{glass}$=1.444. In other words, all scattered light which falls onto a trench 5 at an angle of incidence of greater than 43.83° is totally reflected.

The trenches 5, then, are arranged between the attenuators—formed as Mach-Zehnder interferometers 100—in such a way that the condition of total reflection is met and the scattered light can accordingly be channelled downstream of the attenuators 100. This in turn enables the scattered light to be detected by means of integrated photodiodes 3 in order to indirectly determine the power in the output waveguide 106.

Figure 7:
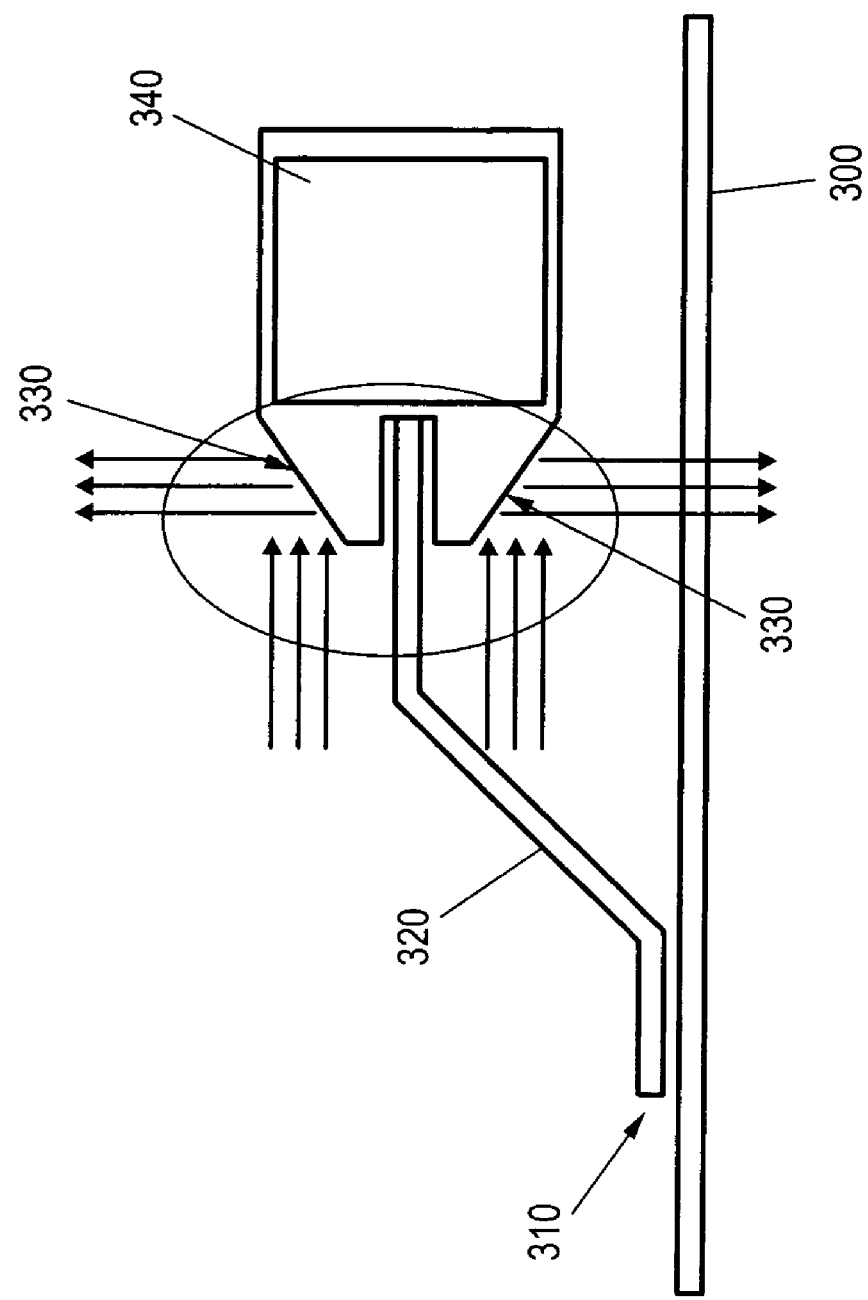
FIG. 7 shows in plan view a detail from a planar optical circuit in which a waveguide serving for power monitoring is terminated in a trench with scattered light-reflecting side areas.

FIG. 7 illustrates a further design of the concept of realizing means for influencing the propagation of scattered light in a planar optical circuit by means that are integrated into the planar optical circuit.

FIG. 7 shows a waveguide or main channel 300, the light power of which is intended to be monitored metrologically. By means of a coupler 310, a specific proportion of the optical signal is coupled out from the main channel 300 and guided via a monitoring waveguide 320 to a photodiode arranged in a trench 340. Usually, 3% of the optical signal of the main channel 300 are coupled out from the main channel and fed to a photodiode for the purpose of power monitoring. The trench 340 terminates the monitoring waveguide 320. The photodiode is not illustrated in FIG. 7 for the sake of clarity.

One problem in conventional power monitoring devices is that the cross section of customary photodiodes is in the region of a few hundred μm. The cross section of the waveguide 320, however, is only a few μm, usually 6×6 μm. This has the effect that the photodiode detects not only the optical signal from the waveguide cross section but also scattered light in the region of the waveguide. It must be taken into consideration here that the signal to be detected, with a proportion of 3% of the main signal, is very small and competes with scattered light from any sources. In particular, scattered light also emerges from simple straight or curved waveguides.

In order that a part of the scattered light is kept away from the photodiode, the trench 340 is configured such that a large part of the scattered light is reflected away from the trench 340 and from the photodiode by means of total reflection. For this purpose, it is provided that the trench 340 is provided with bevels 330 that effect total reflection at its region facing the monitoring waveguide 320, that is to say its input region. Accordingly, only the signal to be detected which is coupled out by the coupler 310 and, to a small extent, scattered light which directly surrounds the monitoring waveguide 320 pass to the photodiode. The proportion of scattered light in the detected signal decreases considerably as a result.

Figure 8:
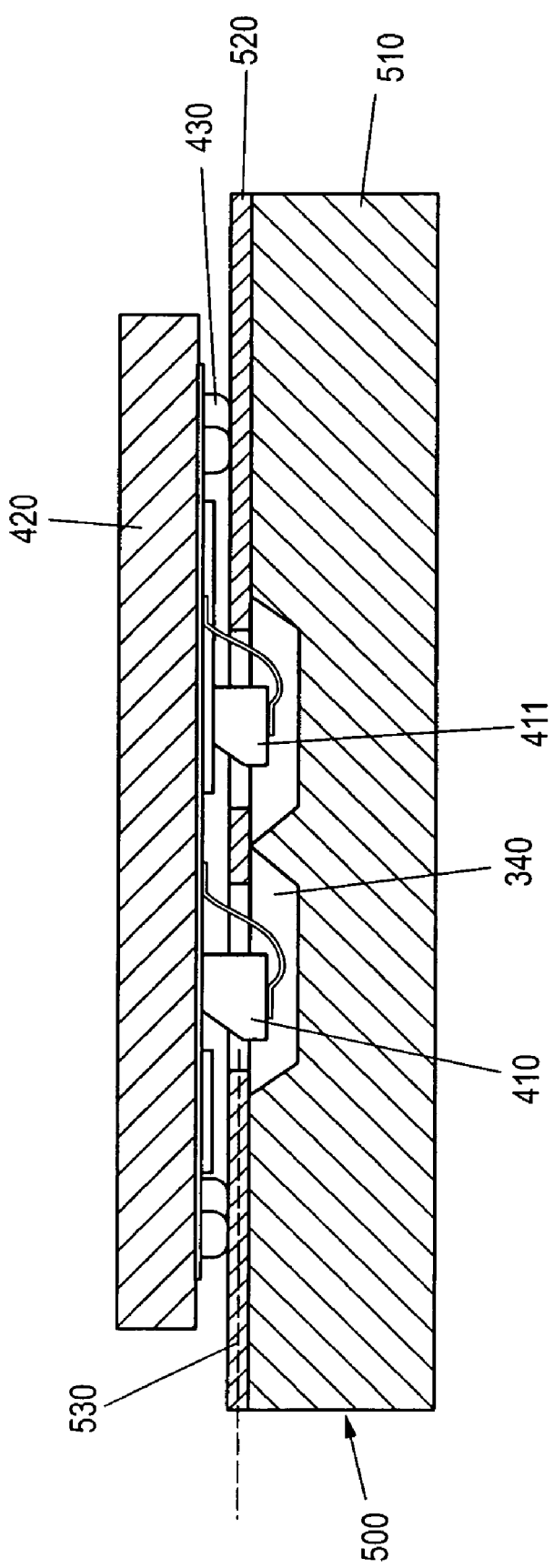
FIG. 8 shows a cross-sectional view of an integrated optical chip, photodiodes being arranged on a submount and the latter being placed upside down onto the integrated optical chip.

FIG. 8 shows by way of example the arrangement of photodiodes in trenches in accordance with the trenches 340 of FIG. 7 using a concrete exemplary embodiment. In this case, a plurality of photodiodes 410, 411 arranged in two rows are mounted on a submount 420 and electrically contact-connected via the latter. The submount 420 with the photodiodes 410, 411 is mounted upside down onto an integrated optical chip or planar optical circuit with an Si carrier substrate 510 and an SiO$_2$ layer system 520 having the wave-guiding structures. In this case, the photodiodes 410, 411 are each sunk in trenches 340 in accordance with the trenches of FIG. 7. Light falling onto a photodiode 410 with a bevelled facet via an optical waveguide 530 is detected by the photodiode 410. The trenches 340 are provided with bevels that effect total reflection in the input region in accordance with the illustration of FIG. 7. This cannot be discerned, however, in the sectional illustration of FIG. 8.

The photodiodes 410, 411 are arranged in two or alternatively more rows since the individual trenches 340 are too large to all be able to be arranged next to one another.

The mounting distance between the integrated optical chip 500 and the submount 420 and also the electrical connection between them are produced by means of soldering bumps 430.

The embodiment of the invention is not restricted to the exemplary embodiments represented above. By way of example, a light-absorbing or light-guiding structure may also be realized in a manner other than by trenches, for example by impurity atoms which are introduced into the wave-guiding substrate and increase a light absorption or provide a light reflection on account of an altered refractive index.

Although the invention has been illustrated and described with respect to one or more implementations, alterations and/or modifications may be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A planar optical circuit, comprising:
   at least one monolithic or hybrid integrated optical component associated with a generally planar substrate;
   a waveguide structure configured to transfer an optical signal associated with the optical component; and
   a scattered light system operable to influence a propagation of scattered light from the optical component in a targeted manner, the scattered light system integrated into the generally planar substrate, wherein the scattered light system comprises a scattered light-reflecting structure associated with the generally planar substrate, the scattered light-reflecting structure including a trench in the generally planar substrate, wherein the trench terminates a monitoring waveguide local to the waveguide structure, and further comprising a photodiode at least partially within the trench.

2. The circuit of claim 1, wherein the trench of tapers substantially symmetrically in the direction of the monitoring waveguide terminated by the trench, wherein the trench comprises two side walls that run toward one another and at which scattered light impinging from the planar optical substrate is reflected away from the trench.

3. The circuit of claim 1, wherein the photodiode is premounted on a submount that is placed upside down onto the generally planar optical substrate.

4. A planar optical circuit, comprising:
- at least one monolithic or hybrid integrated optical component associated with a generally planar substrate, the optical component having an output port;
- a waveguide structure configured to transfer an optical signal associated with the optical component; and
- a scattered light system operable to influence a propagation of scattered light from the output port of the optical component in a targeted manner, the scattered light system integrated into the generally planar substrate, wherein the scattered light system comprises an additional waveguide, one end of which is arranged in the vicinity of the output port of the optical component, wherein the optical component comprises a Mach-Zehnder interferometer with an input port and an output port, and wherein the additional waveguide is arranged in the vicinity of the output port of the Mach-Zehnder interferometer.

5. The circuit of claim 4, wherein the additional waveguide is arranged in a substantially symmetrical arrangement in the region of the output port on both sides of the output waveguide of the Mach-Zehnder interferometer.

6. The circuit of claim 4, wherein the additional waveguide extends in a bent or an S-shaped fashion.

7. The circuit of claim 6, wherein additional waveguide comprises:
- a first, straight region that extends substantially parallel to the waveguide structure; and
- an S-shaped region that adjoins the first straight region.

8. The circuit of claim 4, further comprising a photodiode, wherein an other end of the additional waveguide is terminated by the photodiode.

9. The circuit of claim 8, further comprising an evaluation unit, wherein the photodiode is coupled to the evaluation unit, and wherein the evaluation unit indirectly determines the optical power of the signal at the output of the optical component using the detected scattered light.

10. The circuit of claim 4, wherein the scattered light system comprises a scattered light-reflecting structure associated with the generally planar substrate.

11. The circuit of claim 10, wherein the scattered light-reflecting structure comprises a trench within the generally planar substrate.

12. A planar optical circuit, comprising:
- at least one monolithic or hybrid integrated optical component associated with a generally planar substrate;
- a waveguide structure configured to transfer an optical signal associated with the optical component; and
- a scattered light system operable to influence a propagation of scattered light from the optical component in a targeted manner, the scattered light system integrated into the generally planar substrate so as to be at least partially co-planar with the waveguide structure, wherein the scattered light system comprises a scattered light-absorbing structure associated with the generally planar substrate.

13. The circuit of claim 12, wherein the scattered light-absorbing structure comprises a trench within the generally planar substrate, wherein the trench is filled with a light absorbent substance.

14. The circuit of claim 13, further comprising a plurality of waveguides, and further comprising a plurality of trenches as light-absorbing structures arranged and extending generally parallel to and between the plurality of waveguides, respectively.

15. A planar optical circuit, comprising:
- at least one monolithic or hybrid integrated optical component associated with a generally planar substrate;
- a plurality of waveguides configured to transfer a plurality of optical signals associated with the optical component; and
- a scattered light system operable to influence a propagation of scattered light from the optical component in a targeted manner, the scattered light system integrated into the generally planar substrate, the scattered light system comprising a plurality of trenches as light-reflecting structures associated with the generally planar substrate, the plurality of trenches arranged and extending generally parallel to and between the plurality of waveguides, respectively.

16. The circuit of claim 15, wherein the plurality of waveguides each originate from a Mach-Zehnder interferometer, the scattered light in each case being prevented from coupling into an adjacent waveguide by the trenches extending parallel thereto.

17. The circuit of claim 16, further comprising a plurality of scattered light-detecting photodiodes, wherein each photodiode resides in a region between two neighboring trenches.

18. The circuit of claim 17, wherein each photodiode is coupled to an evaluation unit operable to determine the optical power at the output of a scattered light-emitting optical component using the detected scattered light.

* * * * *

UNITED STATES PATENT AND TRADEMARK OFFICE
CERTIFICATE OF CORRECTION

PATENT NO.        : 7,373,030 B2
APPLICATION NO.   : 10/706492
DATED             : May 13, 2008
INVENTOR(S)       : Gao et al.

It is certified that error appears in the above-identified patent and that said Letters Patent is hereby corrected as shown below:

Title Page
Replace Figure 2 with the figure 2 depicted below, wherein a line to reference "105" has been added.

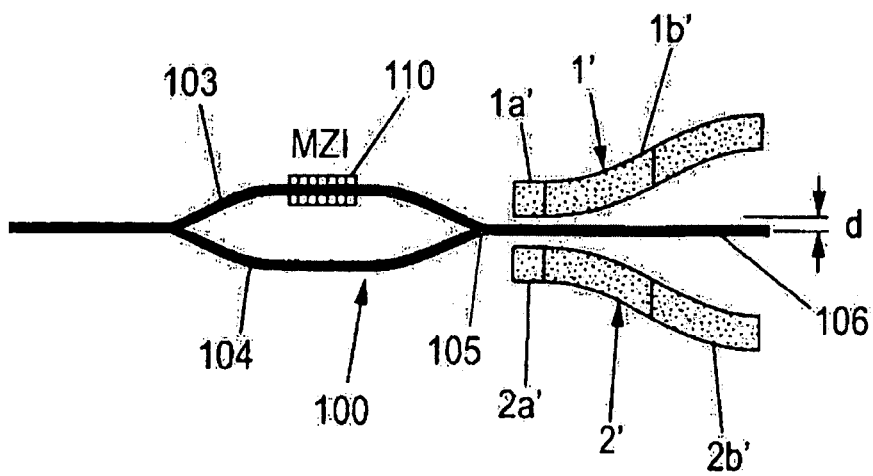

Signed and Sealed this

Nineteenth Day of October, 2010

David J. Kappos
*Director of the United States Patent and Trademark Office*

Drawings
Sheet 1, replace Fig. 2 with the figure depicted below, wherein a line to reference "105" has been added.

FIG. 2

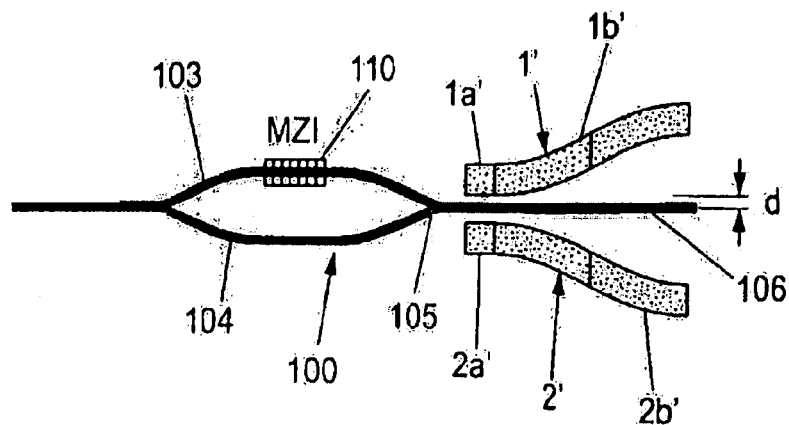

Drawings
Sheet 4, replace Fig. 5 with the figure depicted below, wherein parallel diagonal line filler has been added in the trenches "5" to show the light-absorbing substance and wherein the reference "6" with a line to the light-absorbing substance has been added.

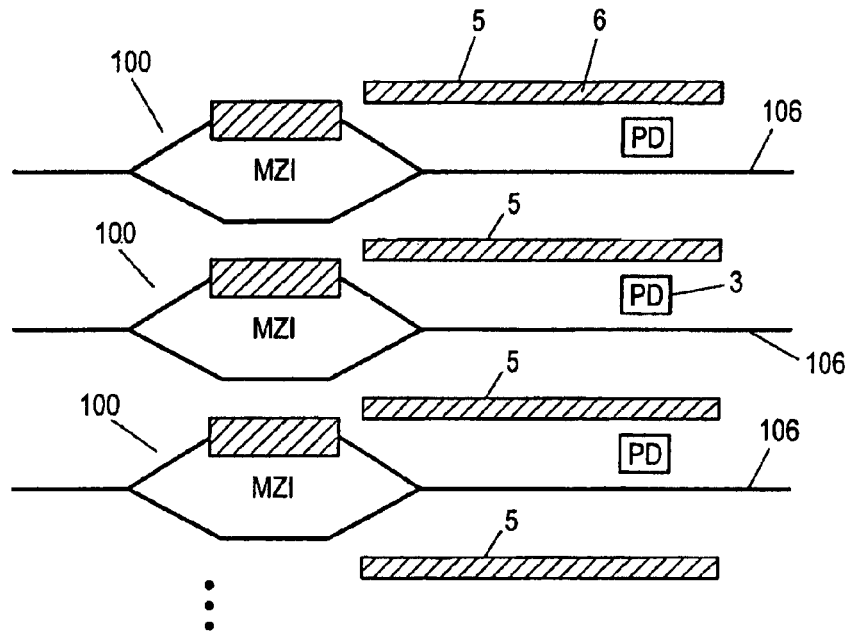

Column 1
Line 8, change "entirety. FIELD" to --entirety.--
Line 41, change "Pin" to --$P_{in}$--
Line 44, change "Pout" to --$P_{out}$--

Column 3
Line 18, change "some, other" to --some other--
Line 51, change "6 μmx6 μm" to --6 μm x 6 μm--

Column 4
Line 54, change "straight region" to --straight section--
Lines 57-58, change "light for example to" to --light, for example, to--
Line 67, change "$P_{out}$=$P_{in}$-2 X" to --$P_{out}$ = $P_{in}$ - 2X--

Column 5
Line 17, change "two waveguides" to --two additional waveguides--
Lines 30-31, change "additional waveguide" to --two additional waveguides--
Line 57, change "factor of 1 000" to --factor 1,000--

Column 6
Line 3, change "attenuator" to --interferometer--
Line 5, change "attenuators" to --interferometers--
Line 21, change "layer for example by" to --layer, for example, by--
Lines 36-37, change "attenuator" to --interferometer--

Column 7
Line 7, change "6x6 μm" to --6 x 6 μm--
Line 13, change ">0.44" to --> 0.44--
Line 15, change "sin α>1/$n_{glass}$." to --sin α > 1/$n_{glass}$.--
Line 15, change ">43.83°" to --> 43.83°--
Line 16, change "$n_{glass}$=1.444." to --$n_{glass}$ = 1.444--
Line 23, change "attenuators" to --interferometers--
Line 37, change "are" to --is--
Line 45, change "6x6 μm" to --6 x 6 μm--

Column 8
Line 2, change "trenches 340" to --trench 340--
Line 12, change "trenches 340" to --trench 340--
Claim 2, line 65, change "of tapers" to --off tapers--

Column 9
Claim 7, line 31, change "wherein additional" to --wherein the additional--